United States Patent
Bonilla et al.

(10) Patent No.: US 9,472,450 B2
(45) Date of Patent: Oct. 18, 2016

(54) GRAPHENE CAP FOR COPPER INTERCONNECT STRUCTURES

(75) Inventors: Griselda Bonilla, Fishkill, NY (US); Christos D. Dimitrakopoulos, Baldwin Place, NY (US); Alfred Grill, White Plains, NY (US); James B. Hannon, Lake Lincolndale, NY (US); Qinghuang Lin, Yorktown Heights, NY (US); Deborah A. Neumayer, Danbury, CT (US); Satoshi Oida, Yorktown Heights, NY (US); John A. Ott, Greenwood Lake, NY (US); Dirk Pfeiffer, Croton on Hudson, NY (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 256 days.

(21) Appl. No.: 13/468,693

(22) Filed: May 10, 2012

(65) Prior Publication Data

US 2013/0299988 A1 Nov. 14, 2013

(51) Int. Cl.
| | |
|---|---|
| *H01L 23/48* | (2006.01) |
| *H01L 23/52* | (2006.01) |
| *H01L 29/40* | (2006.01) |
| *H01L 21/768* | (2006.01) |
| *H01L 23/532* | (2006.01) |

(52) U.S. Cl.
CPC ... *H01L 21/76877* (2013.01); *H01L 21/76849* (2013.01); *H01L 21/76852* (2013.01); *H01L 23/53238* (2013.01); *H01L 21/76835* (2013.01); *H01L 21/76846* (2013.01); *H01L 2924/0002* (2013.01)

(58) Field of Classification Search
USPC .......................................................... 257/751
See application file for complete search history.

(56) References Cited

U.S. PATENT DOCUMENTS

| | | |
|---|---|---|
| 5,695,810 A | 12/1997 | Dubin et al. |
| 6,084,302 A | 7/2000 | Sandhu |
| 6,342,733 B1 | 1/2002 | Hu et al. |
| 6,653,229 B2 * | 11/2003 | Cox .................. H01L 21/32134 257/301 |
| 7,190,079 B2 * | 3/2007 | Andricacos ......... H01L 21/2885 257/758 |
| 7,396,759 B1 | 7/2008 | Van Schravendijk et al. |
| 7,858,989 B2 | 12/2010 | Chen et al. |
| 8,623,761 B2 | 1/2014 | Bonilla et al. |
| 2007/0020918 A1 | 1/2007 | Hirokawa et al. |
| 2008/0251928 A1 | 10/2008 | Chang et al. |

(Continued)

FOREIGN PATENT DOCUMENTS

JP   2012054303 A   3/2012

OTHER PUBLICATIONS

Office Action dated Jul. 15, 2013 received in a related U.S. Patent Application, namely U.S. Appl. No. 13/605,763.

(Continued)

*Primary Examiner* — Marc Armand
*Assistant Examiner* — Wilner Jean Baptiste
(74) *Attorney, Agent, or Firm* — Harness, Dickey & Pierce, P.L.C.

(57) ABSTRACT

Interconnect structures including a graphene cap located on exposed surfaces of a copper structure are provided. In some embodiments, the graphene cap is located only atop the uppermost surface of the copper structure, while in other embodiments the graphene cap is located along vertical sidewalls and atop the uppermost surface of the copper structure. The copper structure is located within a dielectric material.

5 Claims, 5 Drawing Sheets

(56) References Cited

U.S. PATENT DOCUMENTS

| | | | |
|---|---|---|---|
| 2011/0006425 A1* | 1/2011 | Wada et al. | 257/750 |
| 2011/0048625 A1 | 3/2011 | Caldwell et al. | |
| 2011/0059599 A1 | 3/2011 | Ward et al. | |
| 2011/0117328 A1 | 5/2011 | Ivanov | |
| 2011/0201201 A1 | 8/2011 | Arnold et al. | |
| 2011/0303899 A1 | 12/2011 | Padhi et al. | |
| 2012/0056161 A1 | 3/2012 | Avouris et al. | |
| 2012/0080661 A1* | 4/2012 | Saito et al. | 257/29 |
| 2012/0080796 A1 | 4/2012 | Wada et al. | |
| 2012/0097923 A1 | 4/2012 | Liang et al. | |
| 2012/0139114 A1* | 6/2012 | Zhang et al. | 257/751 |
| 2012/0187377 A1 | 7/2012 | Eaton et al. | |
| 2012/0205626 A1 | 8/2012 | Dimitrakopoulos et al. | |
| 2012/0228614 A1* | 9/2012 | Kitamura et al. | 257/52 |
| 2012/0258587 A1 | 10/2012 | Kub et al. | |
| 2012/0326311 A1* | 12/2012 | Yang et al. | 257/751 |

OTHER PUBLICATIONS

Steinhoegl, W. et al., "Size-dependent resistivity of metallic wires in the mesoscopic range", Physical Review B 66, 075414, Aug. 23, 2002.

Avouris, P., et al., "Graphene: synthesis and applications", Materials Today, Mar. 2012, vol. 15, No. 3.

Ruan, G., et al., "Growth of Graphene from Food, Insects, and Waste", ACS Nano, vol. 5, No. 9 , pp. 7601-7607 Jul. 29, 2011.

Li, et al., "Large-Area Synthesis of High-Quality and Uniform Graphene Films on Copper Foils", Science, Jun. 5, 2009 vol. 324.

Schindler, G., et al., "Recent Advantages for Nano Interconnects: Conductor Reliability and Resistivity", Conference Proceedings ULSI XVII, Advanced Metallization Conference 2002 (AMC 2002).

Office Action dated Feb. 14, 2014 received in related U.S. Patent Application, namely U.S. Appl. No. 14/148,183.

Office Action dated Apr. 5, 2013 received in a related U.S. Patent Application, namely U.S. Appl. No. 13/605,763.

International Search Report dated Jul. 22, 2013, received in a corresponding foreign application.

International Search Report dated Nov. 20, 2014 in International Application No. PCT/US2013/035552.

U.S. Office Action dated May 9, 2014 issued in related U.S. Appl. No. 14/148,183.

European Search Report mailed on Dec. 15, 2015.

* cited by examiner

GRAPHENE CAP FOR COPPER INTERCONNECT STRUCTURES

BACKGROUND

The present disclosure relates to semiconductor structures and methods of forming the same. More particularly, the present disclosure relates to interconnect structures for integrated microelectronic circuits which include a graphene cap located atop at least an uppermost surface of an embedded copper structure and methods of forming the same.

The continuous reduction of active semiconductor device dimensions from one technology node (i.e., generation) to the next necessitates a similar scaling of interconnect structures between neighboring devices (e.g., local wires and vias). One of the problems the semiconductor industry faces as cross-sectional wiring dimensions shrink is the pronounced increase in the electrical resistivity of copper, Cu, interconnects with decreasing linewidths. This increase in electrical resistivity is partly due to the increase in surface and grain boundary scattering, and there is a sharp resistivity increase starting at dimensions comparable to the mean free path of electrons in copper.

Furthermore, the highly resistive diffusion barrier(s) surrounding the Cu body of the interconnect structure contributes significantly to total interconnect resistance, at an increasing proportion as dimensions get smaller. As diffusion barrier thickness is scaled down with metal width to meet conductor effective resistivity goals, copper containment becomes increasing problematic, and eventually new copper passivation techniques and/or diffusion-resistant dielectrics are needed. Otherwise, the diffusion barrier thickness will not be possible to be scaled anymore together with scaling pitch. Obviously, this will have adverse effects on line, and especially, via resistances.

SUMMARY

Interconnect structures including a graphene cap located on exposed surfaces of a copper structure are provided. In some embodiments of the present disclosure, the graphene cap is located only atop the uppermost surface of the copper structure, while in other embodiments of the present disclosure the graphene cap is located along vertical sidewalls and atop the uppermost surface of the copper structure. The copper structure is located within, i.e., embedded in, a dielectric material.

In one embodiment of the present disclosure, an interconnect structure is provided that includes at least one copper structure contained within at least one opening present in a dielectric material. The at least one copper structure has an uppermost surface that is coplanar with an uppermost surface of the dielectric material. The interconnect structure of this embodiment of the present disclosure further includes a graphene cap located atop the uppermost surface of the at least one copper structure, wherein the graphene cap has edges that are vertically coincident with edges of the at least one copper structure.

In another embodiment of the present disclosure, an interconnect structure is provided that includes at least one copper structure located between dielectric material portions. The at least one copper structure has sidewall surfaces, an uppermost surface and a bottommost surface. The structure of this embodiment of the present disclosure further includes at least one diffusion barrier material having an uppermost surface in contact with the bottommost surface of the at least one copper structure. The at least one diffusion barrier material has edges that are vertically coincident with the sidewall surfaces of the at least one copper structure. The structure of this embodiment of the present disclosure also includes a graphene cap located atop the uppermost surface of the at least one copper structure and on the sidewall surfaces of the at least one copper structure.

In yet another embodiment of the present disclosure, a method of forming an interconnect structure is provided that includes providing a structure comprising at least one copper structure contained within at least one opening present in a dielectric material, the at least one copper structure having an uppermost surface that is coplanar with an uppermost surface of the dielectric material; and forming a graphene cap atop the uppermost surface of the at least one copper structure, wherein the graphene cap has edges that are vertically coincident with edges of the at least one copper structure.

In a further embodiment of the present disclosure, a method of forming an interconnect structure is provided that includes providing a stack of, from bottom to top, at least one blanket layer of a diffusion barrier material and a blanket layer of copper or a copper alloy; patterning the stack forming at least one copper structure located atop at least one diffusion barrier material portion, wherein the at least one copper structure has edges that are vertically coincident with edges of the at least one diffusion barrier material portion; forming a graphene cap atop an uppermost surface and sidewall surfaces of the at least one copper structure; and forming a dielectric material portion adjacent each side of the at least one copper structure by deposition and etching, wherein each dielectric material portion is separated from one of the sidewall surfaces of the at least on copper structure by at least the graphene cap.

DETAILED DESCRIPTION

Figure 1:
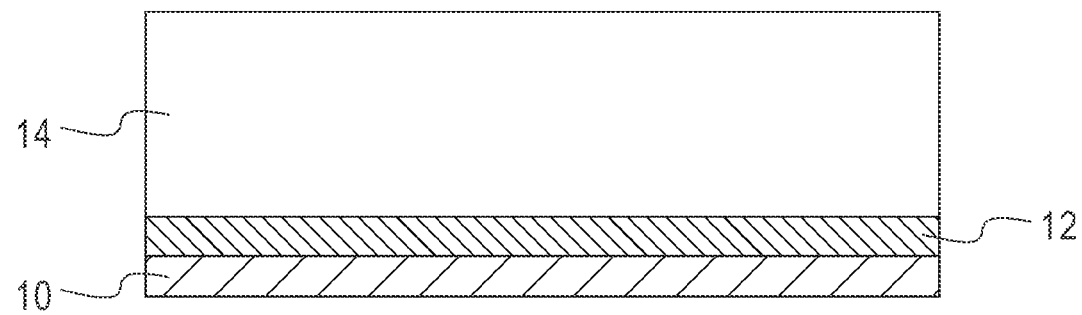
FIG. 1 is a pictorial representation (through a cross-sectional view) illustrating a structure including a substrate, a first dielectric material, and a second dielectric material that can be employed in one embodiment of the present disclosure.

The present disclosure, which discloses interconnect structures for integrated microelectronic circuits which include a graphene cap located atop at least an uppermost surface of a copper structure and methods of forming the same, will now be described in greater detail by referring to the following discussion and drawings that accompany the present application. It is noted that the drawings of the present application are provided for illustrative purposes and, as such, they are not drawn to scale. In the drawings and the description that follows, like elements are referred to by like reference numerals. For purposes of the description hereinafter, the terms "upper", "lower", "right", "left", "vertical", "horizontal", "top", "bottom", and derivatives thereof shall relate to the components, layers and/or elements as oriented in the drawing figures which accompany the present application.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

In the present disclosure, graphene is used as a diffusion barrier and/or cap for copper based interconnect structures. The term "graphene" as used throughout the present disclosure denotes a one-atom-thick planar sheet of $sp^2$-bonded carbon atoms that are densely packed in a honeycomb crystal lattice. The graphene employed in the present disclosure has a two-dimensional (2D) hexagonal crystallographic bonding structure. In some embodiments, the interconnect structures of the present disclosure can have improved electromigration (EM) resistance as a result of utilizing graphene as a diffusion barrier and/or cap for copper interconnect structures. Electromigration is the transport of material caused by the gradual movement of ions in a conductor due to the momentum transfer between conducting electrons and diffusing metal atoms. The effect is important in applications where high direct current densities are used, such as microelectronics and related structures. As the structure size decreases, the practical significance of EM increases.

Reference is now made to FIGS. 1-7 which illustrate an interconnect structure in accordance with one embodiment of the present disclosure and through various stages of forming the same. The interconnect structure of this embodiment (as shown, for example, in FIGS. 6 and 7) includes at least one copper structure 22' contained within at least one opening 16 present in a dielectric material (represented by dielectric material portions 14L, 14R). The at least one copper structure 22' has an uppermost surface that is coplanar with an uppermost surface of the dielectric material. The interconnect structure of this embodiment of the present disclosure further includes a graphene cap 24 located atop the uppermost surface of the at least one copper structure 22', wherein the graphene cap 24 has edges that are vertically coincident with edges of the at least one copper structure 22'. It should be noted that the uppermost surface of the at least one copper structure 22' is horizontally orientated as shown in the drawings of the present application. As such, the graphene cap has vertical sidewall surfaces, i.e., edges that are vertically, with respect to the uppermost surface of the at least one copper structure 22', coincident with the edges (also vertically orientated) of the at least one copper structure 22'.

Referring first to FIG. 1, there is illustrated a structure including a substrate 10, a first dielectric material 12, and a second dielectric material 14 that can be employed in one embodiment of the present disclosure.

The substrate 10 that is employed in the present disclosure can include a semiconductor material such as, for example, Si, SiGe, SiGeC, SiC, Ge alloys, GaAs, InAs, InP and other III/V or II/VI compound semiconductors. The substrate 10 can be a single semiconductor layered substrate or it can be a multi-layered semiconductor substrate.

In one embodiment, the substrate 10 may comprise a bulk semiconductor substrate in which at least one semiconductor material is contiguously present therein. In other embodiments, the substrate 10 may comprise a semiconductor-on-insulator material such as, for example, silicon-on-insulator (SOI) or silicon germanium-on-insulator (SGOI). The substrate 10 can be an intrinsic, i.e., non-doped, semiconductor material. Alternatively, substrate 10 can be a doped semiconductor material. In one embodiment, the substrate 10 is comprised of a single crystalline semiconductor material such as, for example, single crystal silicon.

The substrate 10 may comprise one or more semiconductor devices (not shown in the drawings) such as, for example, resistors, diodes, capacitors, and/or transistors located thereon. The one or more semiconductor devices can be formed utilizing techniques that are well known to those skilled in the art. For example, a transistor can be formed utilizing a gate first or a gate last process.

The first dielectric material 12 of the structure shown in FIG. 1 includes any middle-of-the-line (MOL) dielectric material including, for example, silicon oxide, C-doped oxides (i.e., organosilicates), silsequioxanes, undoped silicate glass (USG), fluorosilicate glass (FSG), borophosphosilicate glass (BPSG), a spin-on low-k dielectric layer, or a plasma enhanced chemical vapor deposited (PECVD) low-k dielectric layer. By "low-k" it is meant a dielectric material having a dielectric constant, k, of less than silicon oxide. The first dielectric material 12 can be formed utilizing a conventional deposition process including, for example, chemical vapor deposition (CVD), plasma enhanced chemical vapor deposition (PECVD), evaporation and spin-on coating.

Contact vias (not shown) are typically present within the first dielectric material 12 and are in contact with conductive surfaces present within and/or the surface of substrate 10. The contact vias (not shown) include a metal such as Cu, Ti, Al or alloys. The contact vias typically extend through the entirety of the first dielectric material 12.

In some embodiments of the present disclosure, the first dielectric material 12 can be omitted from the structure shown in FIG. 1.

The second dielectric material 14 comprises any interlevel or intralevel dielectric material including inorganic dielectrics and/or organic dielectrics. In one embodiment, the second dielectric material 14 is porous. In another embodiment, the second dielectric material 14 is non-porous. Porous dielectric materials typically have a lower dielectric constant than there corresponding non-porous counterparts. The second dielectric material 14 may comprise a same or a different dielectric material as the first dielectric material 12. Some examples of suitable dielectrics that can be used as the second dielectric material 14 include, but are not limited to, silicon oxide, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 12 and the second dielectric material 14 typically have a dielectric constant that is about 4.0 or less, with a dielectric constant of about 2.8 or less being even more typical. All dielectric constants mentioned herein are relative to a vacuum, unless otherwise noted. These dielectrics generally have a lower parasitic cross talk as compared with dielectric materials that have a higher dielectric constant than 4.0. The thickness of the first and second dielectric materials may vary depending upon the dielectric material used as well as the exact number of dielectrics layers within the first and second dielectric materials. Typically, and for normal interconnect structures, the first dielectric material 12 and second dielectric material 14 each have a thickness from 50 nm to 1000 nm.

Figure 2:
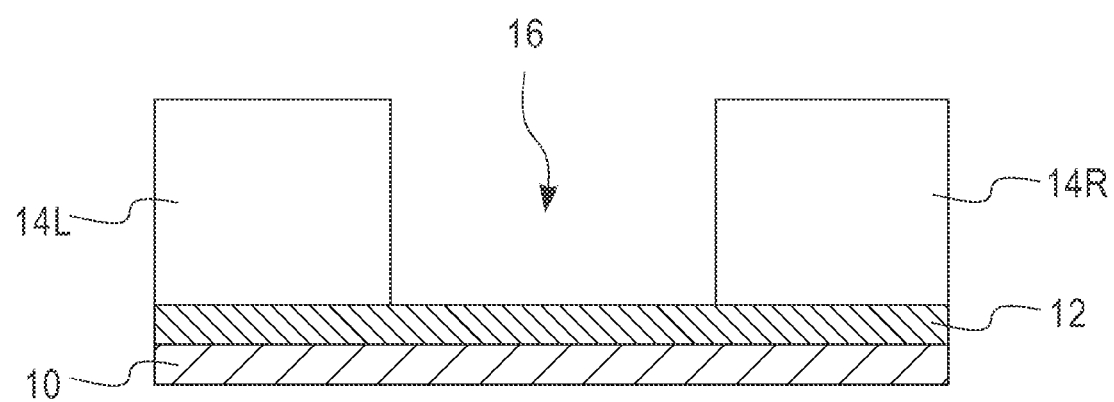
FIG. 2 is a pictorial representation (through a cross-sectional view) illustrating the structure of FIG. 1 after forming at least one opening within the second dielectric material.

Referring now to FIG. 2, there is illustrated the structure of FIG. 1 after forming at least one opening 16 within the original second dielectric material 14. In the drawings, reference numerals 14L and 14R represent second dielectric material portions that are formed after forming the at least one opening 16.

In some embodiments, at least one pad material (not shown) can be formed atop the second dielectric material 14 prior to forming the at least opening 16. The at least one pad material can be used as a pattern mask in the subsequent formation of the at least one opening 16. When the at least one pad material is present, the at least one pad material may be an oxide, nitride, oxynitride or multilayers thereof (e.g., a pad stack comprising a pad oxide and a pad nitride). The at least one pad material typically comprises a semiconductor oxide, a semiconductor nitride and/or a semiconductor oxynitride. In one embodiment, the at least one pad material comprises an oxide of silicon and/or a nitride of silicon.

In some embodiments, the at least one pad material may be formed utilizing any conventional deposition process including, for example, CVD, PECVD, evaporation, chemical solution deposition, physical vapor deposition (PVD) and atomic layer deposition. In other embodiments, the at least one pad material can be formed by a thermal process such as, for example, a thermal oxidation process, and/or a thermal nitridation process. In yet other embodiments, the at least one pad material can be formed utilizing a combination of deposition and thermal processes. The thickness of the at least one pad material may vary depending on the number of pad materials as well as the technique that was used in forming the same. Typically, the at least one pad material has a thickness from 10 nm to 80 nm.

Notwithstanding whether the at least one pad material is or is not employed, the at least one opening 16 can be formed into the second dielectric material 14 by lithography and etching. The lithographic step includes forming a photoresist (organic, inorganic or hybrid) atop the second dielectric material 14 utilizing a conventional deposition process such as, for example, CVD, PECVD and spin-on coating. Following formation of the photoresist, the photoresist is exposed to a desired pattern of radiation. Next, the exposed photoresist is developed utilizing a conventional resist development process.

After the development step, an etching step is performed to transfer the pattern from the patterned photoresist into the second dielectric material 14. When the at least one pad material is present, the etching step transfers the pattern from the patterned photoresist into the at least one pad material and thereafter into the second dielectric material 14. In such an embodiment, the patterned photoresist is typically removed from the surface of the structure after transferring the pattern into the at least one pad material utilizing a conventional resist stripping process such as, for example, ashing. In other embodiments, the patterned photoresist is removed after the pattern is completely transferred into the second dielectric material 14. The etching step used in forming the at least one opening 16 can comprise a dry etching process (including reactive ion etching, ion beam etching, plasma etching or laser ablation), a wet chemical etching process or any combination thereof. Typically, reactive ion etching is used to form the at least one opening 16.

After forming the at least one opening 16, the remaining portions of the at least one pad material can be removed from the structure at this point of the present disclosure by a conventional planarization process such as, for example, chemical mechanical polishing and/or grinding. Alternatively, the remaining portions of the at least one pad material can remain atop the second dielectric material portions 14L, 14R and be removed during a subsequently performed planarization step that is used in forming the embedded copper structure within the second dielectric material.

The at least one opening 16 may include a via opening, a line opening, a combined via and line opening, or any combinations thereof. When a combined via and line opening is formed, a second iteration of lithography and etching is typically used to form the same. Via openings typically have a narrower width than line openings.

Figure 3:
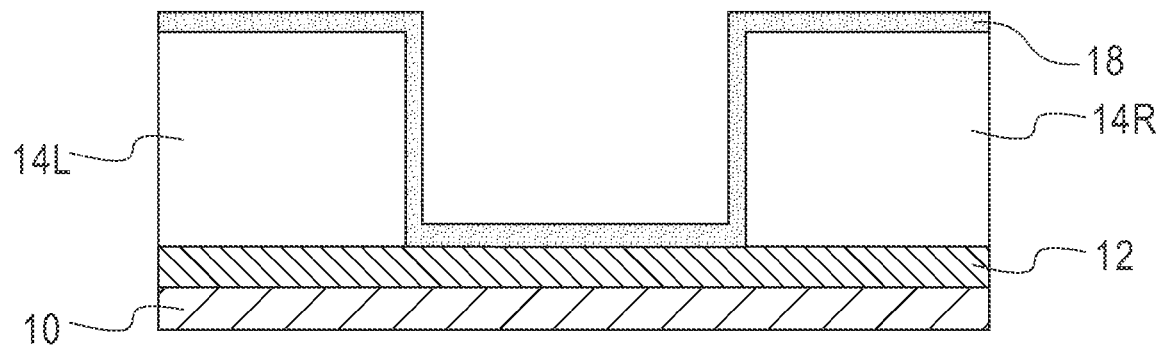
FIG. 3 is a pictorial representation (through a cross-sectional view) illustrating the structure of FIG. 2 after forming a first diffusion barrier material lining within the at least one opening and present atop an uppermost surface of the second dielectric material.

Referring now to FIG. 3, there is illustrated the structure of FIG. 2 after forming a first diffusion barrier material 18 lining the at least opening 16 and an uppermost surface each second dielectric material portion 14L, 14R. The first diffusion barrier material 18 comprises a metal nitride such as, for example, TaN, TiN, RuN, RuTaN, IrTaN, WN or any other metal nitride that can serve as a barrier to prevent conductive material from diffusing there through. The first diffusion barrier material 18 can be formed by any conventional deposition process including, for example, CVD, PECVD, PVD, sputtering and plating. The thickness of the first diffusion barrier 18 may vary depending on the deposition process used as well as the material employed. Typically, the first diffusion barrier material 18 has a thickness from 4 nm to 40 nm.

Figure 4:
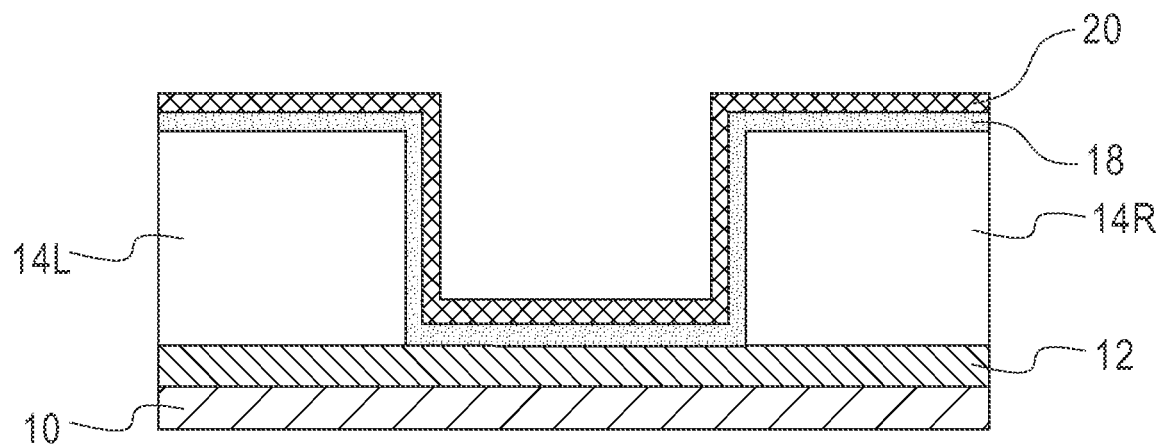
FIG. 4 is a pictorial representation (through a cross-sectional view) illustrating the structure of FIG. 3 after forming a second diffusion barrier material atop the first diffusion barrier material.

Referring now to FIG. 4, there is illustrated the structure of FIG. 3 after forming a second diffusion barrier material 20 atop the first diffusion barrier material 18. The second diffusion barrier material 20 comprises a metal such as, for example, Ta, Ti, Ru, RuTa, IrTa, W or any other metal that can serve as a barrier to prevent conductive material from diffusing there through. The second diffusion barrier material 20 can be formed by any conventional deposition process including, for example, CVD, PECVD, PVD, atomic layer deposition (ALD), sputtering and plating. The thickness of the second diffusion barrier material 20 may vary depending on the deposition process used as well as the material employed. Typically, the second diffusion barrier material 20 has a thickness from 4 nm to 40 nm.

In some embodiments, a single layered diffusion barrier including one of the above mentioned metal or metal nitride diffusion barrier materials can be used instead of the multilayered diffusion barrier including the first and second diffusion barrier materials 18, 20 illustrated in the drawings of the present disclosure.

In other embodiments, an optional plating seed layer (not shown) can be formed on the second diffusion barrier material 20 prior to forming a layer of copper or a copper alloy. The optional plating seed layer is employed to selectively promote subsequent electroplating of the layer of copper or a copper alloy. The optional plating seed layer may comprise Cu, a Cu alloy, Jr, an Jr alloy, Ru, a Ru alloy (e.g., TaRu alloy) or any other suitable noble metal or noble metal alloy having a low metal-plating overpotential. Typically, Cu or a Cu alloy plating seed layer is employed. The thickness of the optional seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, and PVD.

Figure 5:
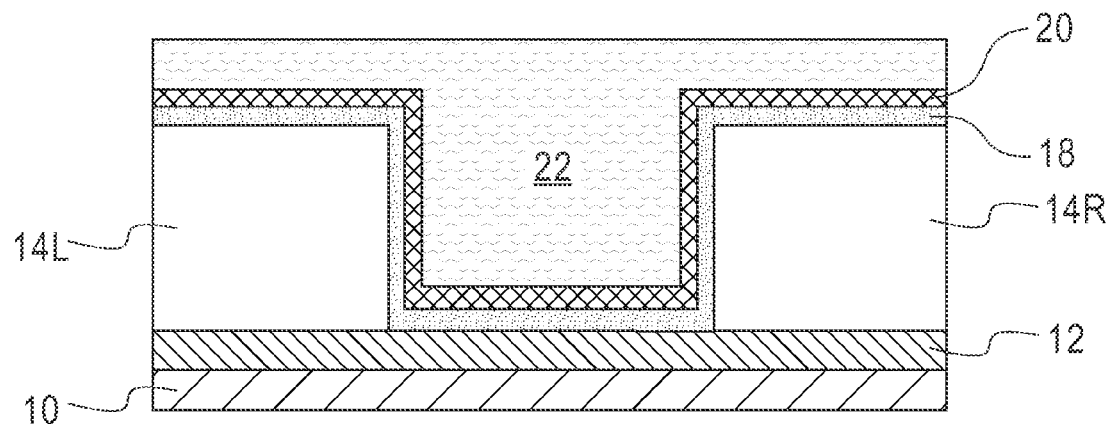
FIG. 5 is a pictorial representation (through a cross-sectional view) illustrating the structure of FIG. 4 after forming a layer of copper or a copper alloy atop the second diffusion barrier material.

Referring now to FIG. 5, there is illustrated the structure of FIG. 4 after forming a layer of copper or a copper alloy atop the second diffusion barrier material 20. The layer of copper or copper alloy, which is labeled as element 22 in the drawings, fills the remaining portions of the at least one opening and extends onto the uppermost surface of the second diffusion barrier material 20 that is present outside of the at least one opening 16. The term "copper alloy" denotes a compound that comprises copper and at least one other element such as, for example, Al. The layer of copper or copper alloy 22 can be formed utilizing any conventional deposition process including, for example, CVD, PECVD, PVD, sputtering, plating, chemical solution deposition and electroless plating. As shown, the layer of copper or copper alloy 22 fills the remaining portion of the at least one opening 16 and extends onto the exposed uppermost surface of the second diffusion barrier material 20 that is present on the uppermost surface of each second dielectric portion 16L, 16R.

Figure 6:
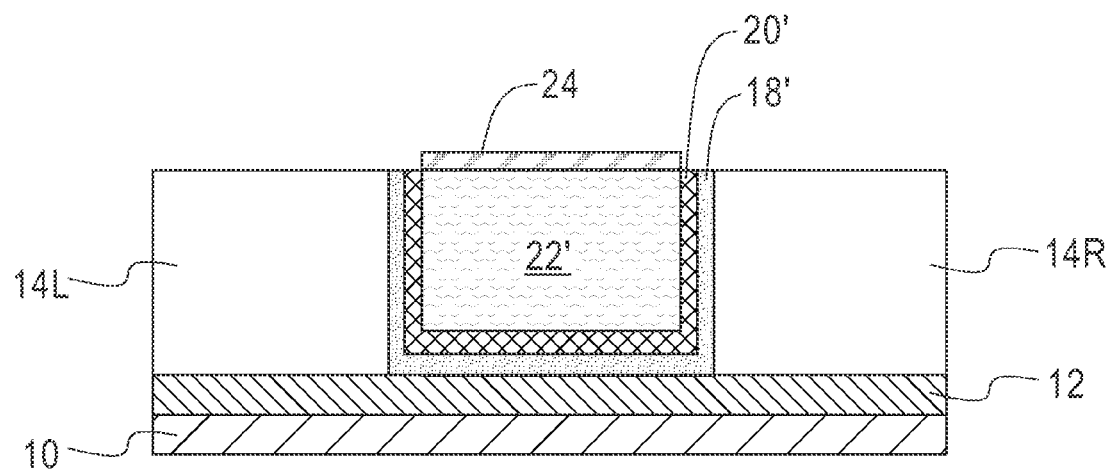
FIG. 6 is a pictorial representation (through a cross-sectional view) illustrating the structure of FIG. 5 after planarization and forming a graphene cap atop an embedded copper structure, wherein the graphene cap has edges which are vertically coincident with edges of the embedded copper structure.

Referring now to FIG. 6, there is illustrated the structure of FIG. 5 after planarization and forming a graphene cap 24 atop a copper structure 22', which is embedded within the original second dielectric material 14 between second dielectric material portions 14L and 14R. The copper structure 22' thus can be referred to herein as embedded copper structure 22'. The graphene cap 24 of the present disclosure has a high conductivity (on the order of $10^{-6}$ $\Omega \cdot$cm in suspended graphene, lower in graphene deposited on substrates) and, most importantly, it has the ability to prevent diffusion of Cu through it.

The planarization process used in providing the structure shown in FIG. 6 may include chemical mechanical polishing (CMP) and/or grinding. The planarization process provides a planar structure in which the uppermost surfaces of the second dielectric material portions 14L, 14R, the remaining second diffusion barrier material 20' (which is now U-shaped), the remaining first diffusion barrier material 18' (which is also now U-shaped) and the embedded copper structure 22' (i.e., remaining portions of the layer of copper or copper alloy 22) are substantially coplanar with each other. The term "U-shaped" denotes that the layer includes two vertical portions which extend upwards from a horizontal connecting portion. If not previously done, the remaining portions of the at least one pad material can be removed from the structure during this planarization step of the present disclosure.

In this embodiment, the graphene cap 24 is formed directly on the uppermost surface of the copper structure 22'. The graphene cap 24 has edges which are vertically coincident with edges of the embedded copper structure 22. As such, the graphene cap 24 does not extend onto the uppermost surface of any of the second dielectric material portions 14L, 14R, the remaining second diffusion barrier material 20' (which is now U-shaped), and the remaining first diffusion barrier material 18'. The graphene cap 24 is thus selectively positioned only atop the exposed uppermost surface of the copper structure 22'.

The graphene cap 24 can be comprised of single-layer graphene (nominally 0.34 nm thick), few-layer graphene (2-10 graphene layers), multi-layer graphene (>10 graphene layers), a mixture of single-layer, few-layer, and multi-layer graphene, or any combination of graphene layers mixed with amorphous and/or disordered carbon phases that result by graphene formation at lower temperatures (between 200° C. and 900° C.). The graphene cap 24 can also include, if desired, substitutional (where C atoms in graphene are replaced with dopant atoms covalently bonded to next nearest neighbor, nnn, atoms), and dopant atoms or molecules that do not form covalent bonds to graphene and lie on top of the graphene layer or between graphene layers in the case few layer or multilayer intercalated graphene.

In one embodiment the graphene cap 24 can be formed utilizing a selective deposition process such as chemical vapor deposition (CVD), plasma enhanced chemical vapor deposition (PECVD), or ultraviolet (UV) assisted CVD. The selective deposition process that can be employed in the present disclosure occurs on any metallic surface such as, for example, Cu, Ru, Ir, Rh, Pt, Co and alloys thereof, which catalyze graphene growth. The selective deposition, i.e., catalytic growth, of graphene, on metallic surfaces can be performed at a temperature up to, but not exceeding, 400° C. In one embodiment, the selective growth of graphene occurs at a temperature from 200° C. to 400° C. In another embodiment, the selective growth of graphene occurs at a temperature from 350° C. to 400° C. It is noted that growth temperatures which exceed 400° C. are not used in Cu containing interconnect structures since at such high temperature the integrity and service lifetime of the Cu interconnects can be negatively affected. The selective deposition process that can be used in the present disclosure for graphene growth includes utilizing any known carbon sources including, for example, benzene, propane, ethane and other hydrocarbons, and other C-containing gases.

If higher quality graphene is necessary to be used for forming an effective cap layer, then graphene that is initially grown on Cu foils can be transferred onto the surface of the interconnect level that needs to be capped, and then be optionally patterned by photolithography and RIE, so that the graphene cap has edges which coincide with edges of the embedded copper structure. One or more graphene layers can be transferred sequentially using a single step or multi-step transfer process, respectively. The Cu foils as well as any base substrate that the Cu foils might be located thereon can be removed during the transfer process.

When a selective deposition process is used in forming graphene cap 24, the growth of the graphene cap 24 is catalyzed by the copper or copper alloy present in copper structure 22'. Growth of graphene does not however occur on dielectric surfaces such as the exposed uppermost surfaces of the second dielectric material portions 14L, 14R.

It is noted that in the structure shown in FIG. 6, the bottommost surface of the copper structure is separated from an uppermost surface of the first dielectric material 12 by a horizontal connecting portion of the remaining portions of first and second diffusion barrier materials 18' and 20', respectively.

Figure 7:
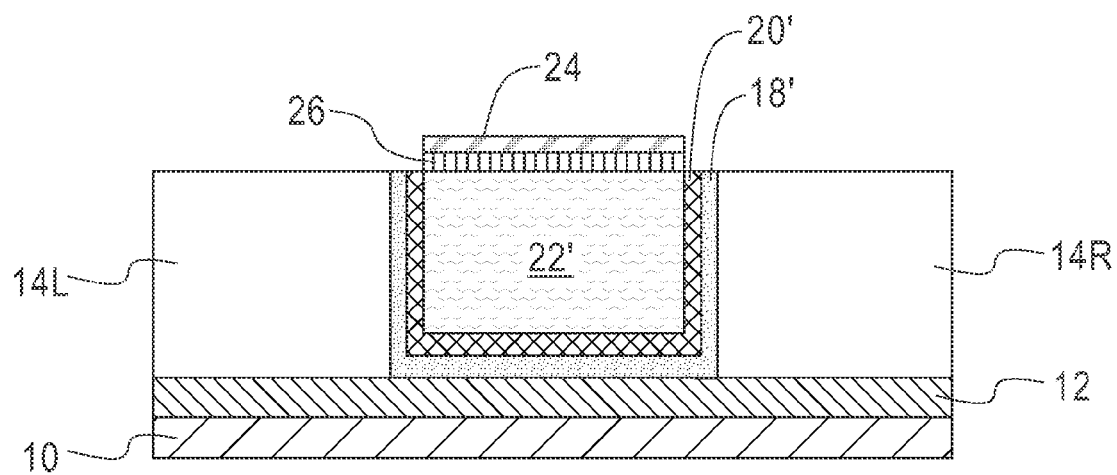
FIG. 7 is a pictorial representation (through a cross-sectional view) illustrating the structure of FIG. 5 after planarization, forming a metal-containing cap, and forming a graphene cap atop an embedded copper structure, wherein the graphene cap, and the metal-containing cap have edges which are vertical coincident with edges of the copper structure.

Referring now to FIG. 7, there is illustrated the structure of FIG. 5 after planarization, forming a metal-containing cap 26 atop an embedded copper structure 22', and forming a graphene cap 24 atop the metal-containing cap, wherein the graphene cap 24, and the metal-containing cap 26 have edges which are vertically coincident with edges of the copper structure 22'. The structure shown in FIG. 7 is formed utilizing the same processing steps used in forming the structure shown in FIG. 6 except that prior to graphene formation a metal-containing cap 26 is selectively formed atop the copper structure 22'. Such metal has to possess catalytic properties for graphene formation, if a low temperature graphene growth method were to be used. Otherwise, the alternative method of graphene transfer and patterning, needs to be used to form the graphene cap on top of the metal-containing cap 26.

The metal-containing cap 26 includes any metal that is more resistant to corrosion or oxidation than copper or a copper alloy. In one embodiment, the metal-containing cap 26 may comprise a potential graphenization catalyst such as, for example, Ru, Ir, Pt, Co, Rh, or alloys thereof such as a CoW, or CoWP alloy. In some embodiments, the metal-containing cap 26 is comprised of a multilayered metal and/or metal alloy stack. The thickness of the metal-containing cap 26 may vary depending on the type of metal and/or metal alloy present in the cap, the deposition technique and conditions used as well as the number of metals and/or metal alloys within the cap. Typically, the metal-containing cap 26 has a thickness from 1 Å to 100 Å. The metal-containing cap 26 is selectively formed atop the copper structure 22' utilizing a chemical deposition process including, for example, CVD, PECVD, low pressure CVD and ALD. The metal-containing cap 26 is typically formed within the same temperature range (i.e., up to, but not exceeding 400° C.) as that used to grow the graphene cap 24.

In some embodiments, the growth of the graphene cap 24 is catalyzed by the metal or metal alloy within metal-containing cap 26. Growth of graphene does not however occur on dielectric surfaces such as the exposed uppermost surfaces of the second dielectric material portions 14L, 14R.

Reference is now made to FIGS. 8-12 which illustrate an interconnect structure in accordance with another embodiment of the present disclosure and through various stages of forming the same. The interconnect structure of this embodiment (as shown, for example, in FIG. 12) includes at least one copper structure 28' located between dielectric material portions 14L and 14R. The at least one copper structure 28' has sidewall surfaces, an uppermost surface and a bottommost surface. The structure of this embodiment further includes at least one diffusion barrier material (represented by the second diffusion barrier material portion 20') having an uppermost surface in contact with the bottommost surface of the at least one copper structure 28'. The at least one diffusion barrier material (represented by both the first and second dielectric material portions 18' and 20') has edges that are vertical coincident with the sidewall surfaces of the at least one copper structure 28'. The structure of this embodiment also includes a graphene cap 24' located atop the uppermost surface of the at least one copper structure 28' and on the sidewall surfaces of the at least one copper structure 28'.

Figure 8:
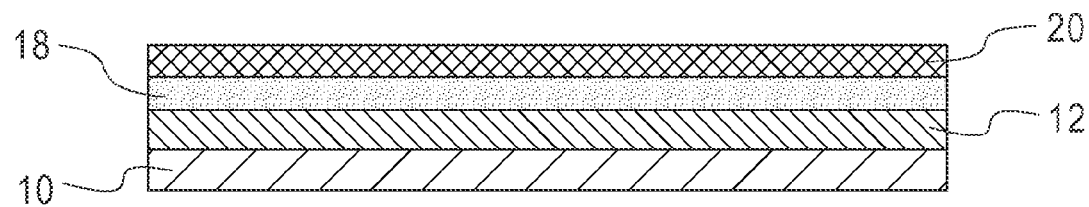
FIG. 8 is a pictorial representation (through a cross-sectional view) illustrating a structure including, from bottom to top, a substrate, a first dielectric material, a blanket layer of a first diffusion barrier material, and a blanket layer of a second diffusion barrier material that can be employed in another embodiment of the present disclosure.

Referring now to FIG. 8, there is shown a structure including, from bottom to top, a substrate 10, a first dielectric material 12, a blanket layer of a first diffusion barrier material 18, and a blanket layer of a second diffusion barrier material 20 that can be employed in another embodiment of the present disclosure. The substrate 10, first dielectric material 12, the first diffusion barrier material 18 and the second diffusion barrier material 20 include materials and thicknesses which were mentioned above in the previous embodiment of the present disclosure.

The first dielectric material 12, the first diffusion barrier material 18 and the second diffusion barrier material 20 can be formed utilizing one of the techniques mentioned above in the previous embodiment of the present disclosure.

In some embodiments (not shown), a single diffusion barrier material can be used in place of the dual diffusion barrier materials illustrated in FIG. 8. Also, and in some other embodiments, an optional plating seed layer (as described above) can also be used in this embodiment of the present disclosure.

Figure 9:
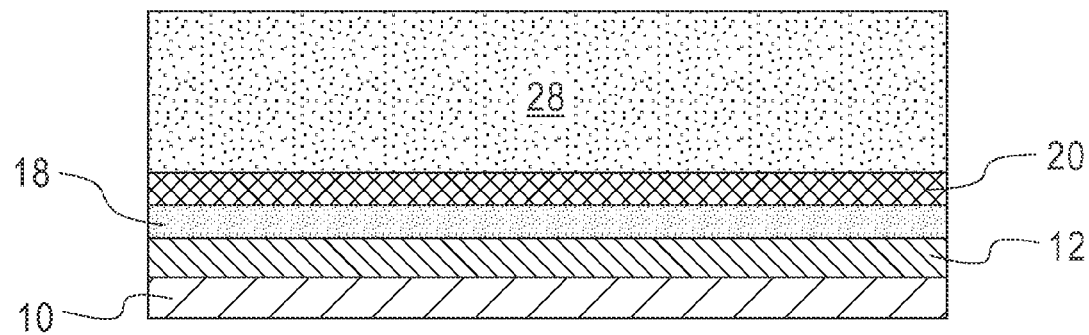
FIG. 9 is a pictorial representation (through a cross-sectional view) illustrating the structure of FIG. 8 after forming a blanket layer of copper or a copper alloy atop the blanket layer of the second diffusion barrier material.

Referring now to FIG. 9, there shown the structure of FIG. 8, after forming a blanket layer of copper or a copper alloy 28 atop the blanket layer of the second diffusion barrier material 20. The blanket layer of copper or copper alloy 28 can be formed utilizing one of the techniques mentioned above in forming the layer of copper or copper alloy 22.

Figure 10:
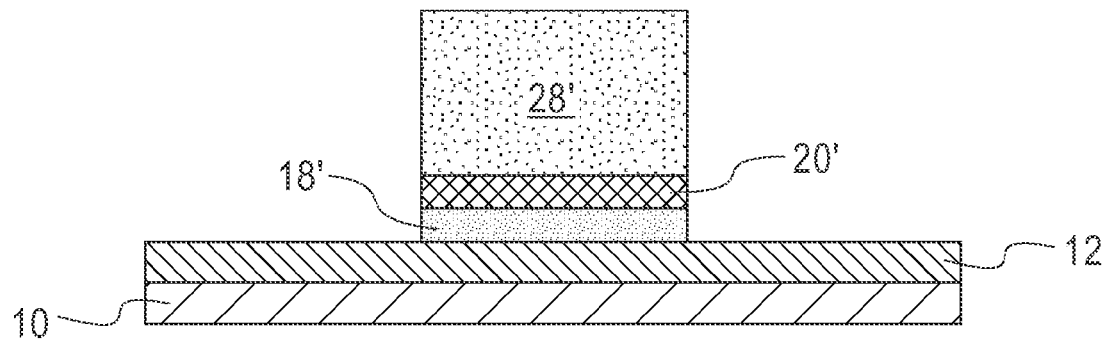
FIG. 10 is a pictorial representation (through a cross-sectional view) illustrating the structure of FIG. 9 after patterning the blanket layer of a copper or copper alloy, the blanket layer of the second diffusion barrier material, and the blanket layer of the first diffusion barrier material.

Referring now to FIG. 10, there is illustrated the structure of FIG. 9 after patterning the blanket layer of a copper or copper alloy 28, the blanket layer of the second diffusion barrier material 20, and the blanket layer of the first diffusion barrier material 18. In FIG. 10, reference numeral 28' denotes a copper structure (i.e., remaining portion of the blanket layer of copper or copper alloy 28), reference numeral 20' denotes a remaining portion of the blanket layer of second diffusion barrier 20, and reference numeral 18' denotes a remaining portion of the blanket layer of first diffusion layer 18. In the structure illustrated in FIG. 10, the copper structure 28', remaining portion of the blanket layer of second diffusion barrier 20', and remaining portion of the blanket layer of first diffusion layer 18' have edges that are vertically coincident with each other. The structure shown in FIG. 10 can be formed utilizing photolithography and etching. A single etch, or multiple etching processes can be used in forming the structure shown in FIG. 10. The etching stops atop the uppermost surface of the first dielectric material 12.

Figure 11:
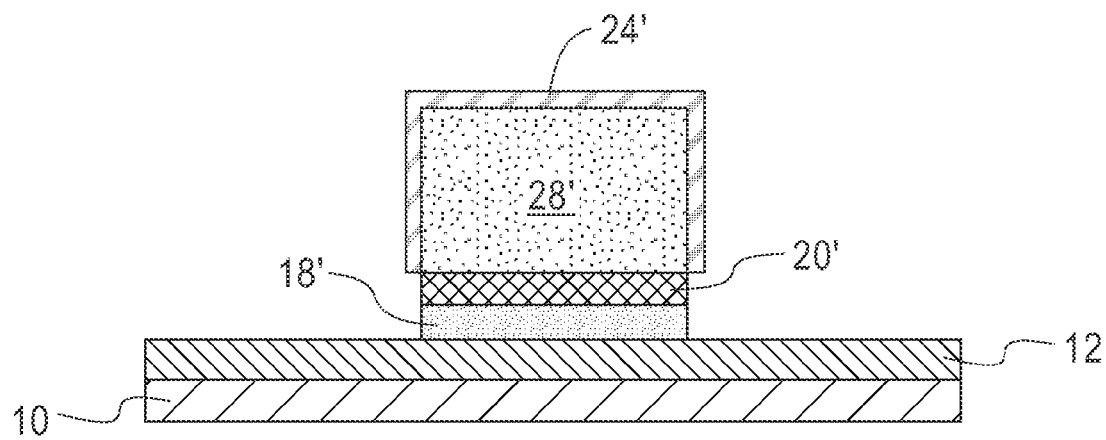
FIG. 11 is a pictorial representation (through a cross-sectional view) illustrating the structure of FIG. 10 after forming a copper structure and after forming a graphene cap on all exposed surfaces of the copper structure.

Referring now to FIG. 11, there is illustrated the structure of FIG. 10 after forming a graphene cap 24' on all exposed surfaces of the copper structure 28'. In this embodiment, the graphene cap 24' is contiguously located on exposed vertical sidewalls, i.e., sidewalls surfaces, and the uppermost surface of copper structure 28'. The graphene cap 24' of this embodiment can be formed utilizing the same processes (i.e., selective deposition or transferring) as mentioned in the previous embodiment of the present disclosure wherein graphene cap 24 was only formed on the exposed uppermost structure of the copper structure 22'.

In some embodiments, and prior to forming the graphene cap 24', a metal-containing cap (not shown) can be formed on the exposed vertical surfaces (i.e., sidewall surfaces) and uppermost surface of the copper structure 28' and thereafter the graphene cap 24' can be formed atop the metal-containing cap with the methods described in the previous embodiments. The metal-containing cap is contiguously present on the sidewall surfaces and the uppermost surface of the at least one copper structure 28'. When a metal-containing cap is formed, the metal-containing cap includes one of the metals mentioned above for metal-containing cap 26 and one of the techniques mentioned above in forming metal-containing cap 26 can also be used here in this embodiment of the present disclosure.

Figure 12:
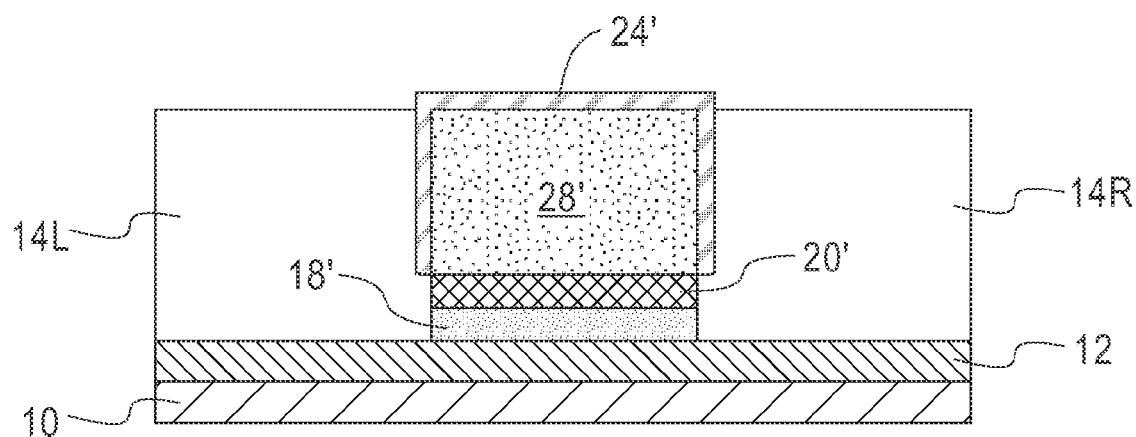
FIG. 12 is a pictorial representation (through a cross-sectional view) illustrating the structure of FIG. 11 after forming dielectric material portions adjacent to the graphene-capped copper structure.

Referring now to FIG. 12, there is illustrated the structure of FIG. 11 after forming dielectric material portions 14L, 14R adjacent to the graphene-capped copper structure. The dielectric material portions 14L, 14R are formed by first depositing one of the second dielectric materials mentioned above for second dielectric material 14 and then etching back the deposited second dielectric material utilizing a conventional etch back process.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. An interconnect structure comprising:
   at least one copper structure located between dielectric material portions, said at least one copper structure having sidewall surfaces, an uppermost surface and a bottommost surface; and
   at least one diffusion barrier material having an uppermost surface in contact with said bottommost surface of said at least one copper structure, said at least one diffusion barrier material having edges that are vertically coincident with said vertical sidewall surfaces of said at least one copper structure,
   a graphene cap located atop said uppermost surface of said at least one copper structure and on said sidewall surfaces of said at least one copper structure.

2. The interconnect structure of claim 1, wherein said at least one diffusion barrier material comprises a first diffusion barrier material and a second diffusion barrier material, wherein said first diffusion barrier material is selected from a metal nitride, and said second diffusion barrier material is selected from a metal.

3. The interconnect structure of claim 1 further comprising another dielectric material located beneath said at least one diffusion barrier material.

4. The interconnect structure of claim 3, further comprising a substrate comprising at least one semiconductor material located beneath said another dielectric material.

5. The interconnect structure of claim 1, wherein said graphene cap comprises single-layer graphene, few-layer graphene, multi-layer graphene a mixture of single-layer, few-layer, and multi-layer graphene, or any combination of graphene layers mixed with amorphous and/or disordered carbon phases.

* * * * *